(12) United States Patent
Basker et al.

(10) Patent No.: US 10,840,360 B2
(45) Date of Patent: *Nov. 17, 2020

(54) NANOSHEET DEVICE WITH CLOSE SOURCE DRAIN PROXIMITY

(71) Applicant: International Business Machines Corporation, Armonk, NY (US)

(72) Inventors: Veeraraghavan S. Basker, Schenectady, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,117

(22) Filed: Jul. 19, 2019

(65) Prior Publication Data

US 2019/0341467 A1    Nov. 7, 2019

Related U.S. Application Data

(63) Continuation of application No. 15/847,894, filed on Dec. 19, 2017, now Pat. No. 10,439,049.

(51) Int. Cl.
| | |
|---|---|
| H01L 29/66 | (2006.01) |
| H01L 29/78 | (2006.01) |
| H01L 29/06 | (2006.01) |
| H01L 29/10 | (2006.01) |
| H01L 29/167 | (2006.01) |
| H01L 29/08 | (2006.01) |
| H01L 29/786 | (2006.01) |

(Continued)

(52) U.S. Cl.
CPC ...... *H01L 29/6681* (2013.01); *H01L 29/0653* (2013.01); *H01L 29/0673* (2013.01); *H01L 29/0847* (2013.01); *H01L 29/1045* (2013.01); *H01L 29/167* (2013.01); *H01L 29/6653* (2013.01); *H01L 29/66545* (2013.01); *H01L 29/66553* (2013.01); *H01L 29/7853* (2013.01); *H01L 29/78618* (2013.01); *H01L 29/78696* (2013.01); *H01L 21/3065* (2013.01); *H01L 21/30608* (2013.01); *H01L 29/165* (2013.01); *H01L 29/42392* (2013.01); *H01L 29/7848* (2013.01)

(58) Field of Classification Search
CPC .......... H01L 29/42392; H01L 29/6681; H01L 29/0673
See application file for complete search history.

(56) References Cited

U.S. PATENT DOCUMENTS

| | | |
|---|---|---|
| 8,778,768 B1 | 7/2014 | Chang et al. |
| 9,121,820 B2 | 9/2015 | Liu et al. |

(Continued)

*Primary Examiner* — Didarul A Mazumder
*Assistant Examiner* — Wasiul Haider
(74) *Attorney, Agent, or Firm* — Daniel P. Morris, Esq.; Hoffmann & Baron, LLP

(57) ABSTRACT

A nanosheet transistor device having reduced access resistance is fabricated by recessing channel nanosheets and replacing the channel material with epitaxially grown doped extension regions. Sacrificial semiconductor layers between the channel nanosheets are selectively removed without damaging source/drain regions epitaxially grown on the extension regions. The sacrificial semiconductor layers are replaced by gate dielectric and gate metal layers.

15 Claims, 13 Drawing Sheets

(51) Int. Cl.
  *H01L 21/3065* (2006.01)
  *H01L 29/423* (2006.01)
  *H01L 21/306* (2006.01)
  *H01L 29/165* (2006.01)

(56) References Cited

U.S. PATENT DOCUMENTS

| | | |
|---|---|---|
| 9,287,357 B2 | 3/2016 | Rodder et al. |
| 9,318,553 B1 | 4/2016 | Cheng et al. |
| 10,439,049 B2 * | 10/2019 | Basker .................. B82Y 10/00 |
| 2015/0053928 A1 | 2/2015 | Ching et al. |
| 2016/0020305 A1 | 1/2016 | Obradovic et al. |
| 2016/0027929 A1 | 1/2016 | Cheng et al. |
| 2016/0071729 A1 | 3/2016 | Hatcher et al. |
| 2017/0053998 A1 | 2/2017 | Kim et al. |
| 2018/0047832 A1 | 2/2018 | Tapily et al. |

* cited by examiner

NANOSHEET DEVICE WITH CLOSE SOURCE DRAIN PROXIMITY

CROSS-REFERENCE TO RELATED APPLICATIONS

This application is a continuation of U.S. patent application Ser. No. 15/847,894, filed Dec. 19, 2017, now issued as U.S. Pat. No. 10,439,049, having the same title and inventors as the present application, the disclosure of which is hereby incorporated by reference herein in its entirety for all purposes.

BACKGROUND

The present invention relates generally to the electrical, electronic and computer arts and, more particularly, to nanosheet transistors and the formation of spacers in such transistors.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased throughput current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

Nanosheet FETs have been under development for possible use in tight pitch applications such as 7 nm nodes and beyond. Such FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors.

A sequence of steps that may be employed during fabrication of a nanosheet transistor is shown in FIGS. 1A-1G. The structure 20 shown in FIG. 1A includes a stack of semiconductor layers including silicon layers 21 and silicon germanium layers 22 grown epitaxially in alternating sequence. The semiconductor layers can be formed on a substrate 23 such as a bulk semiconductor (e.g. silicon) substrate or a semiconductor-on-insulator substrate. As shown in FIG. 1B, dummy gates 24 and gate spacers 26 are formed on the top surface of the stack of semiconductor layers. The dummy gates 24 are typically amorphous silicon or polycrystalline silicon. Outer spacers 26 are formed on the dummy gates. A conformal silicon nitride layer may be deposited on the structure and patterned to form the outer spacers. The dummy gates 24 and outer spacers 26 protect the underlying portion of the stack of semiconductor layers while the exposed portions thereof are removed to form columns 25 of semiconductor nanosheets as shown in FIG. 1C. The silicon germanium layers 22 are undercut by a timed etch to form divots 27 between the silicon layers 21, as shown in FIG. 1D. A conformal dielectric layer, for example silicon nitride, is deposited on the structure, thereby filling the divots. The conformal dielectric layer is subjected to a timed etch to remove the dielectric material outside the stack of semiconductor layers. The remaining dielectric material forms inner spacers 28 between the silicon layers 21, as shown in FIG. 1D. Source/drain semiconductor material 29, for example doped silicon germanium, is then epitaxially grown on the exposed end portions of the silicon layers 21. A structure as shown in FIG. 1E is obtained at this stage of the process. A gate stack is formed later in the process between the channel layers (silicon layers 21) of the structure by removing the dummy gate and replacing it with gate materials such as high-k gate dielectric 30 and gate conductor metal 32. A structure as shown in FIG. 1F may be obtained.

The configurations of nanosheet devices as shown in FIG. 1F lead to difficulties in extension formation which can lead to higher access resistance in the devices. The areas in which extension regions are to be formed are indicated by arrows in FIG. 1F.

BRIEF SUMMARY

An exemplary nanosheet field-effect transistor device includes a vertical stack of nanosheet channel layers, each nanosheet channel layer consisting essentially of monocrystalline silicon and including a pair of lateral edges. A doped epitaxial extension region is on one of the lateral edges of each of the nanosheet channel layers. Gate stacks are in alternating sequence with and operatively associated with the nanosheet channel layers. Pairs of inner spacers adjoin opposite end portions of the gate stacks and are vertically aligned with the doped epitaxial extension regions. A gate electrode extends vertically from a top surface of the gate stack and within a pair of outer dielectric spacers. Epitaxial source/drain regions are operatively associated with the nanosheet channel layers. The source/drain regions directly contact the doped epitaxial extension regions. The epitaxial source/drain regions and the doped epitaxial extension regions are comprised of different semiconductor materials.

A first exemplary method of fabricating a nanosheet field-effect transistor includes obtaining a monolithic structure including a vertical stack of nanosheet channel layers and sacrificial silicon germanium layers. The nanosheet channel layers and sacrificial silicon germanium layers are arranged in alternating sequence. The nanosheet channel layers are greater in width than the sacrificial silicon germanium layers and include lateral edge portions extending laterally beyond the sacrificial silicon germanium layers. The monolithic structure further includes a dummy gate on the vertical stack and a dielectric outer spacer including vertical sidewalls extending over the dummy gate. Dielectric inner spacers adjoin the sacrificial silicon germanium layers and are located beneath the lateral edge portions of the nanosheet channel layers. The nanosheet channel layers are laterally recessed, thereby forming a plurality of divots bounded by the inner spacers and portions of the sacrificial silicon germanium layers. Doped semiconductor extension regions are epitaxially grown on the nanosheet channel layers and within the plurality of divots and source/drain regions are epitaxially grown on the doped semiconductor extension regions. The dummy gate is removed to form a trench bounded by the vertical sidewalls of the dielectric outer spacer. The sacrificial silicon germanium layers are removed selectively with respect to the nanosheet channel layers and the doped semiconductor extension regions to form a plurality of spaces between and in alternating sequence with the nanosheet channel layers. A gate dielectric layer within the trench and on the nanosheet channel layers and gate metal is deposited over the gate dielectric layer.

A further method of fabricating nanosheet field-effect transistors includes obtaining a monolithic structure including a plurality of vertical stacks of monocrystalline silicon nanosheet channel layers and sacrificial silicon germanium layers, the nanosheet channel layers and sacrificial silicon germanium layers being arranged in alternating sequence and the sacrificial silicon germanium layers having greater widths than the widths of the nanosheet channel layers. Doped epitaxial extension regions are on the nanosheet channel layers. Inner spacers adjoin the silicon germanium layers and are vertically aligned with the doped epitaxial extension regions. The monolithic structure further includes epitaxial silicon germanium source/drain regions on the doped epitaxial extension regions, a plurality of dielectric dummy gates, each dielectric dummy gate extending vertically from a top surface of one of the vertical stacks, and a plurality of dielectric outer spacers, each of the outer spacers including a pair of vertical sidewalls adjoining one of the dielectric dummy gates. The dielectric dummy gates are removed to form trenches within the vertical sidewalls of the outer spacers. The sacrificial silicon germanium layers are removed selective to the nanosheet channel layers and the doped epitaxial extension regions to form spaces between the nanosheet channel layers without erosion of the source/drain regions. A gate dielectric layer is formed within the trenches and on the nanosheet channel layers and gate metal is deposited over the gate dielectric layer.

Techniques and structures as disclosed herein can provide substantial beneficial technical effects. By way of example only and without limitation, one or more embodiments may provide one or more of the following advantages:

Reduced access resistance;
Relatively close source drain proximity;
Prevention of erosion of source/drain regions;
Correct doping levels in extensions.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1A:
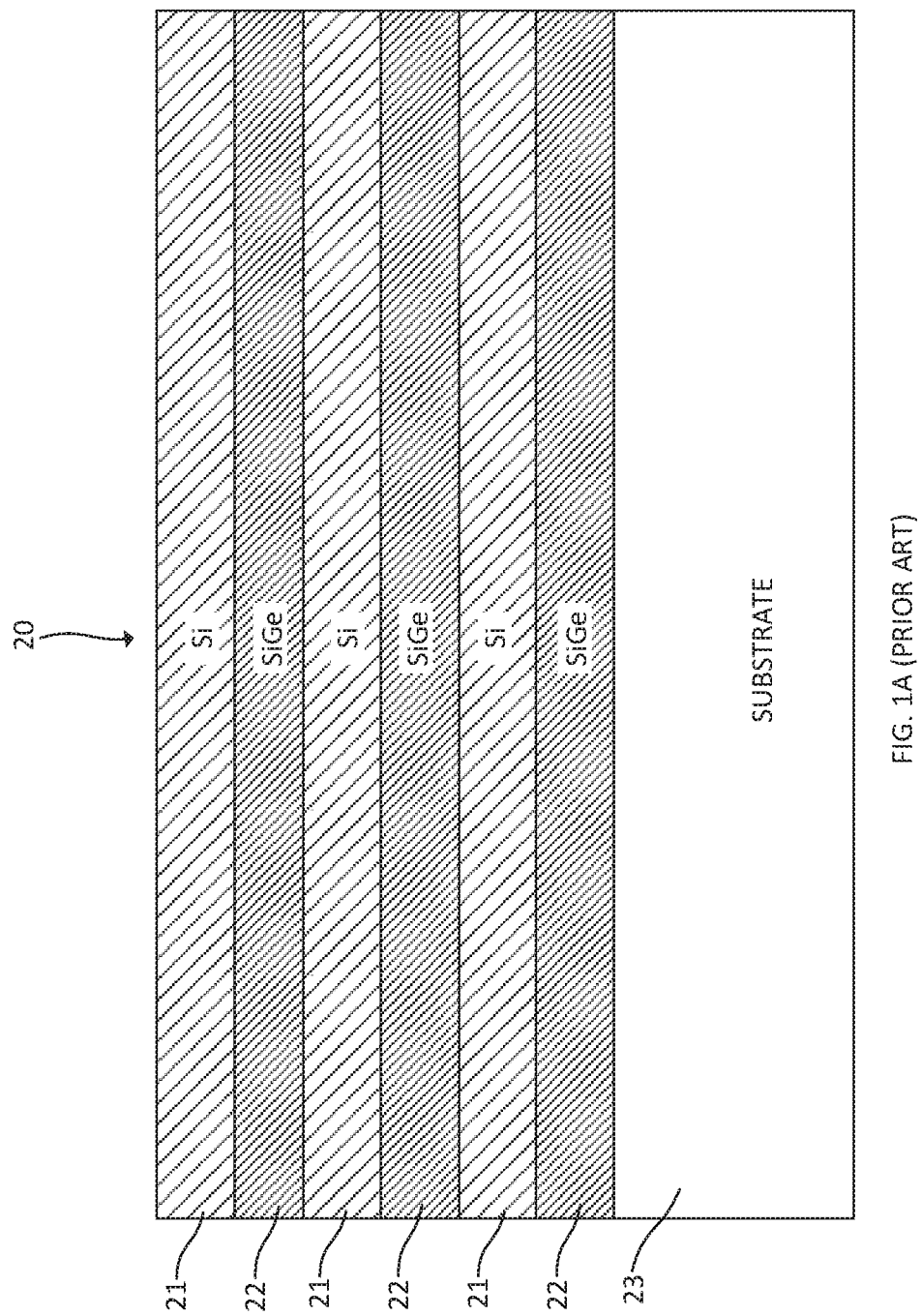
FIGS. 1A-1F are schematic, cross-sectional views showing sequential steps in a prior art process of fabricating a nanosheet field-effect transistor.
Figure 1B:
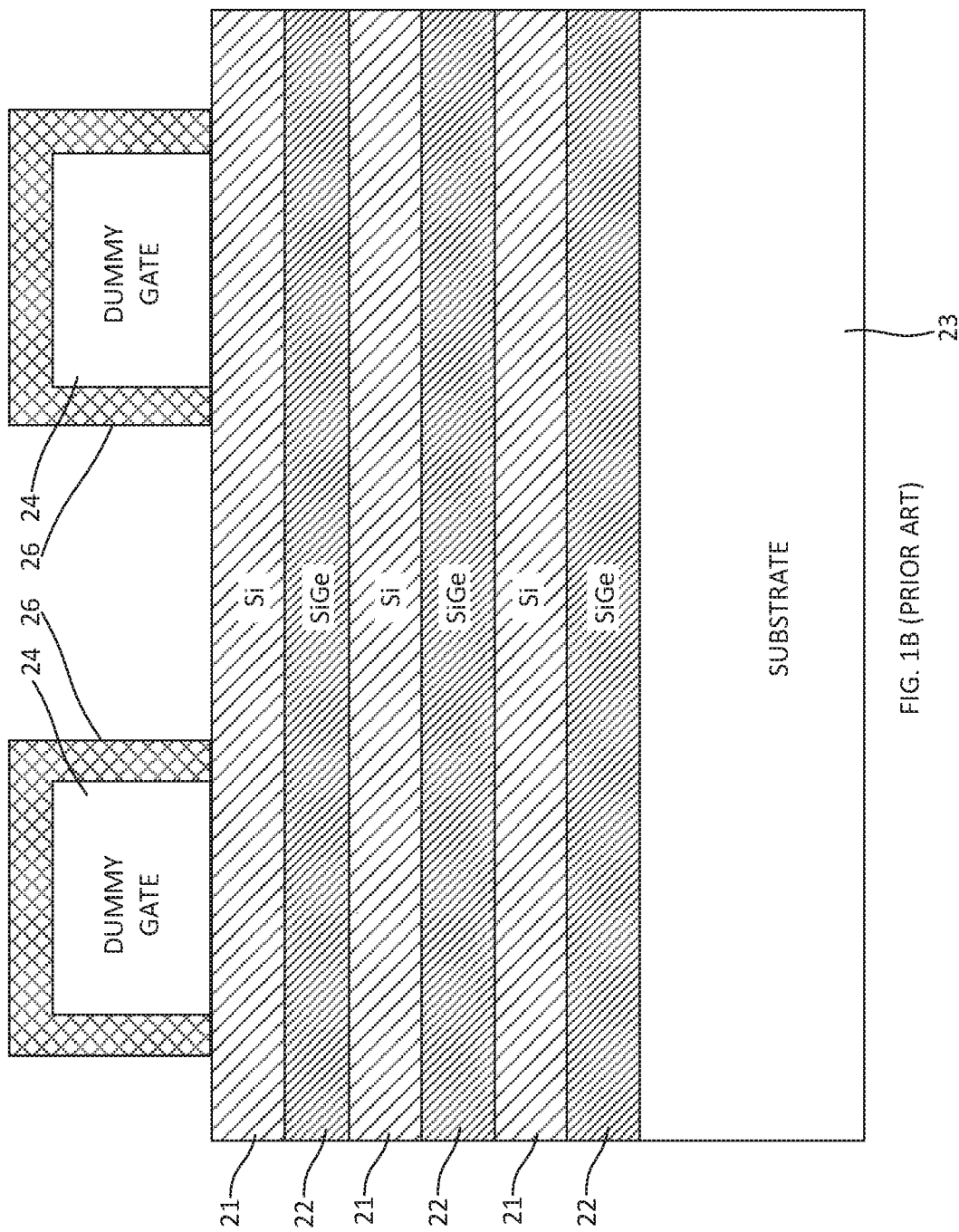
Figure 1C:
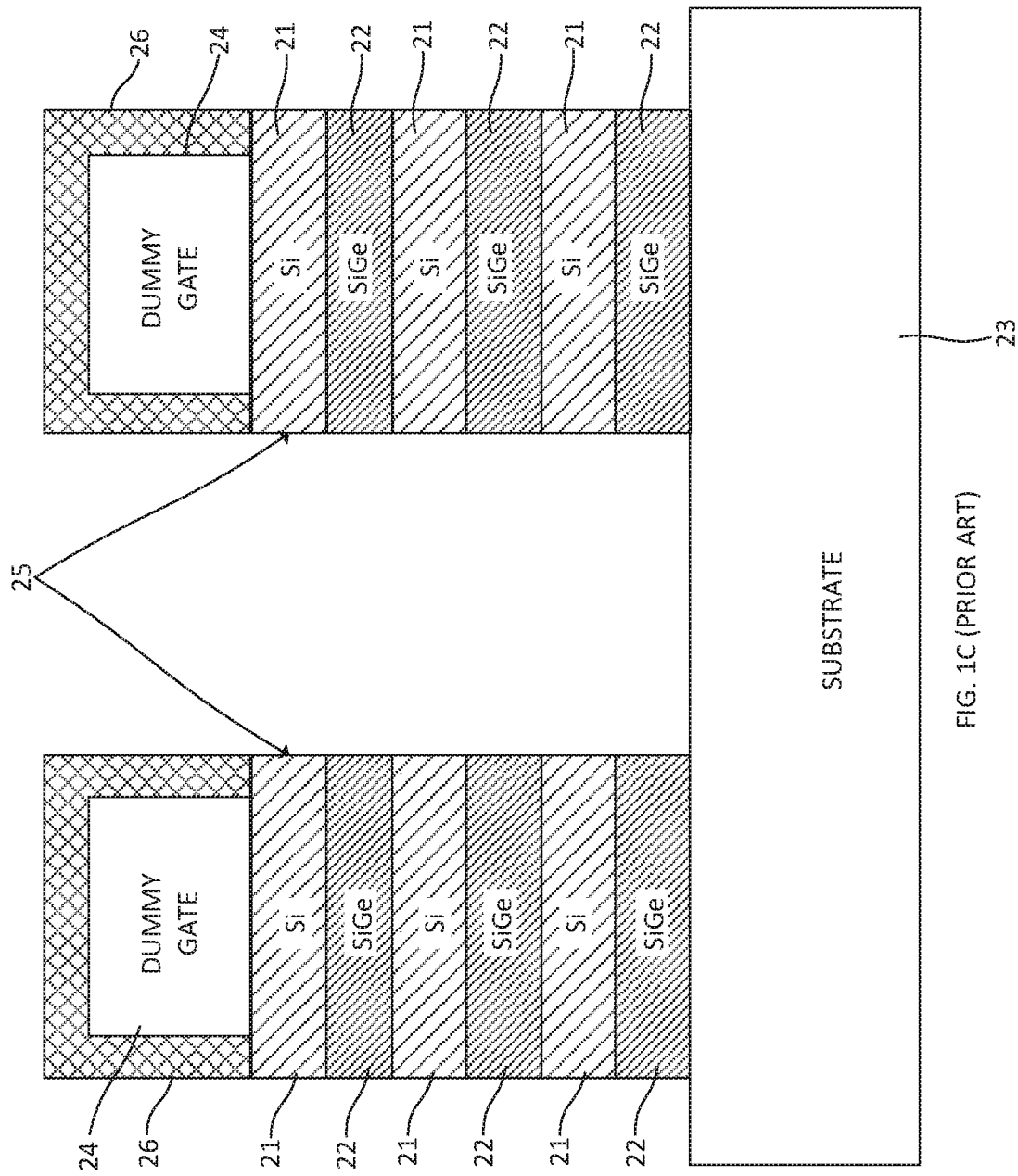
Figure 1D:
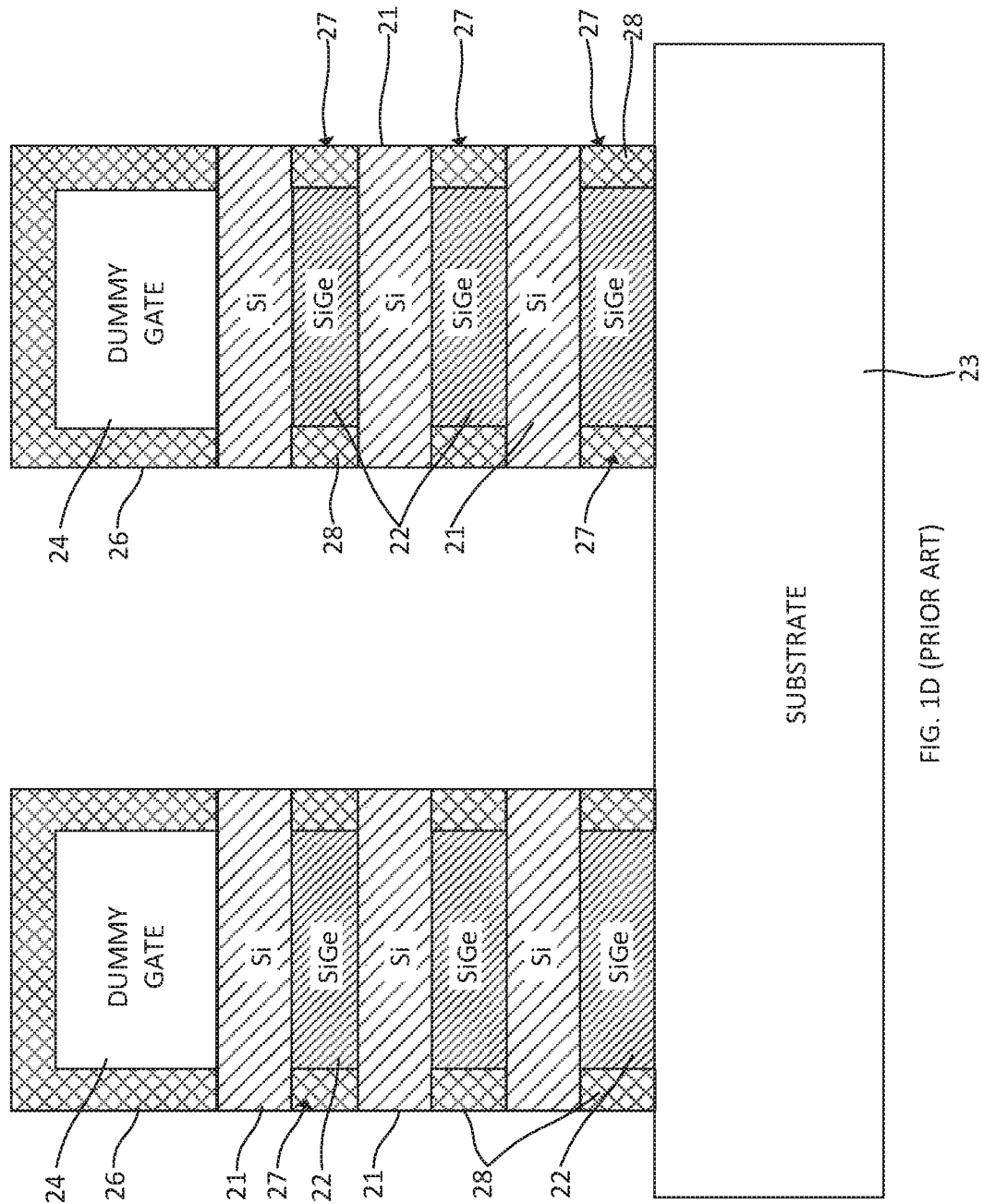
Figure 1E:
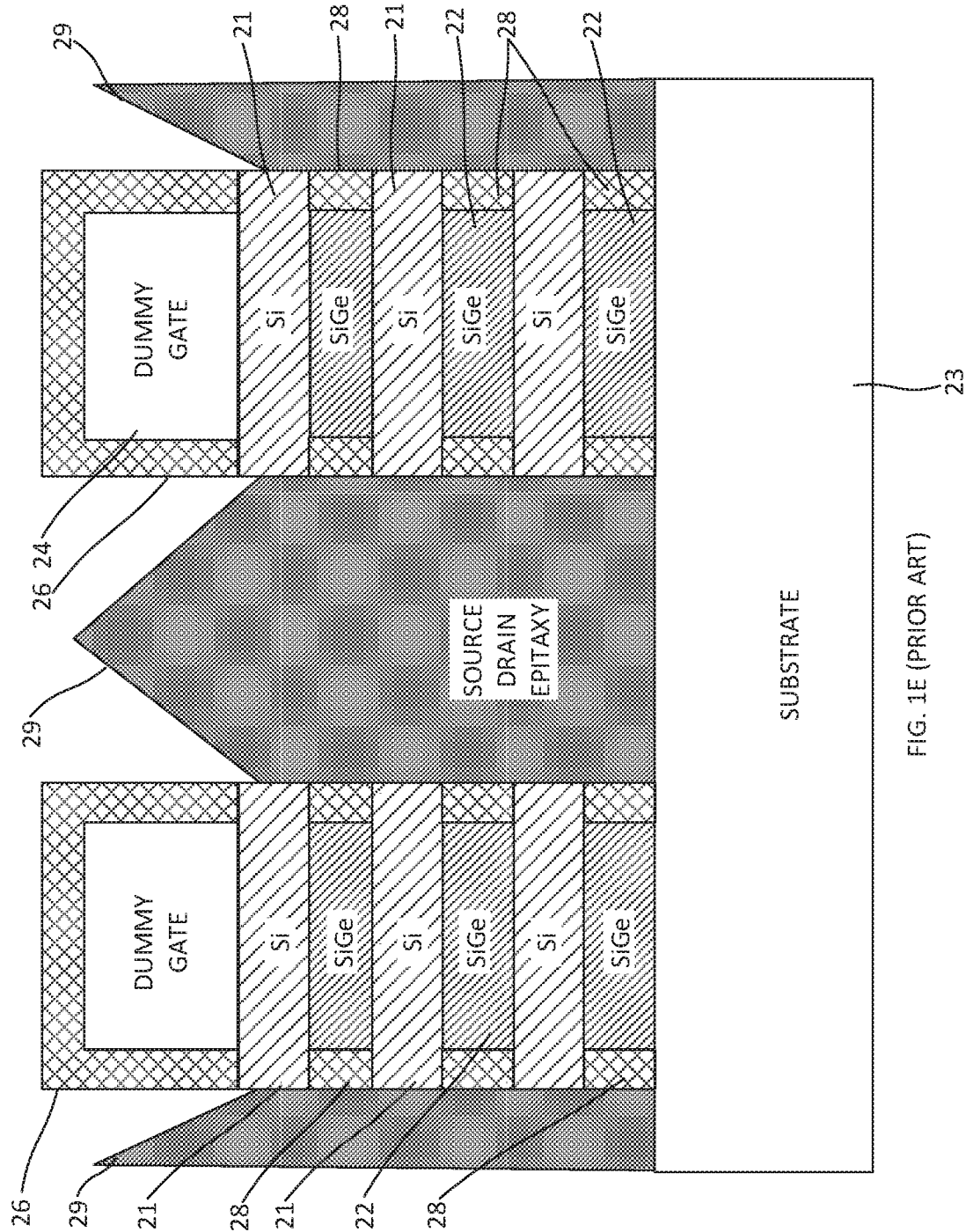
Figure 1F:
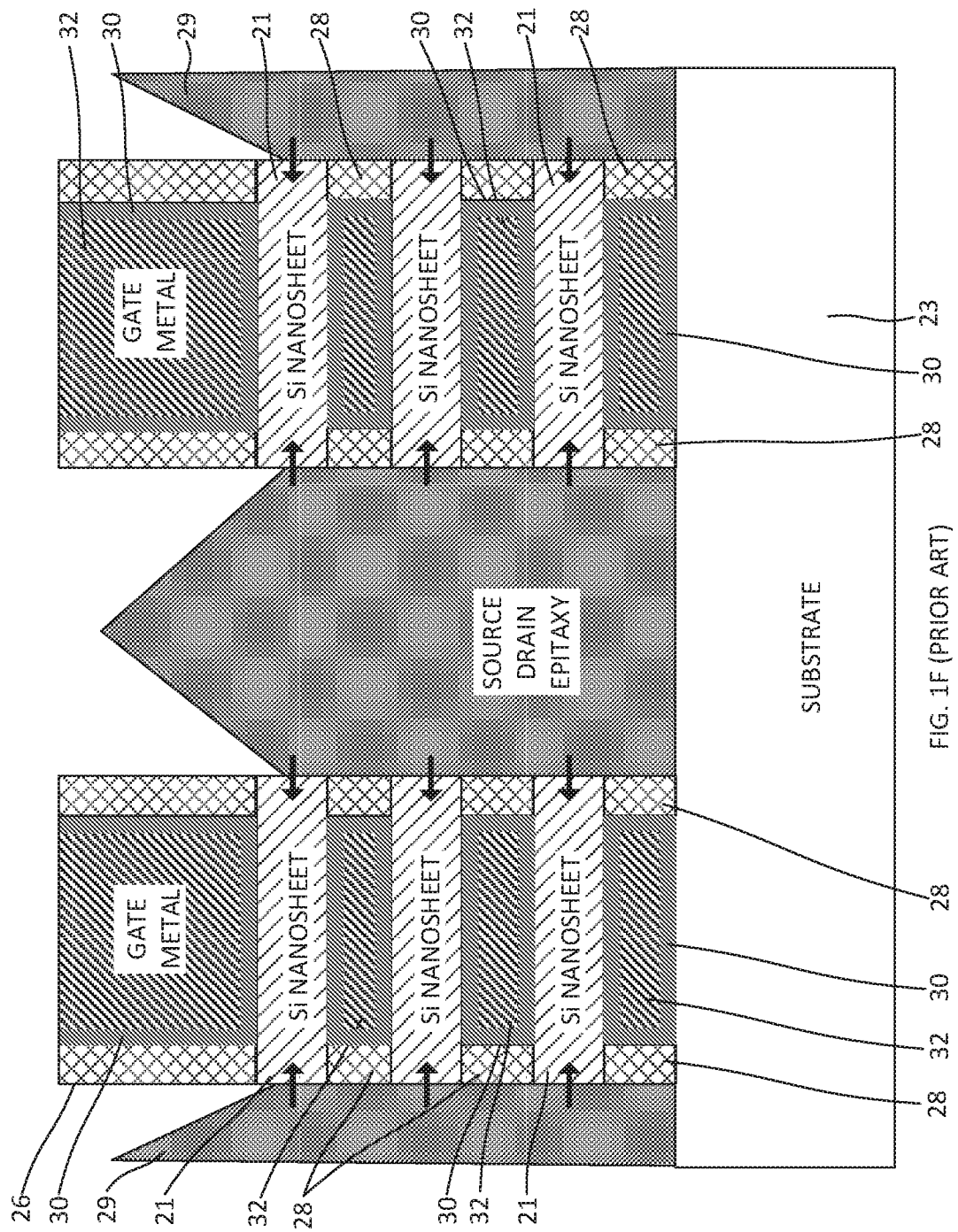
Figure 2A:
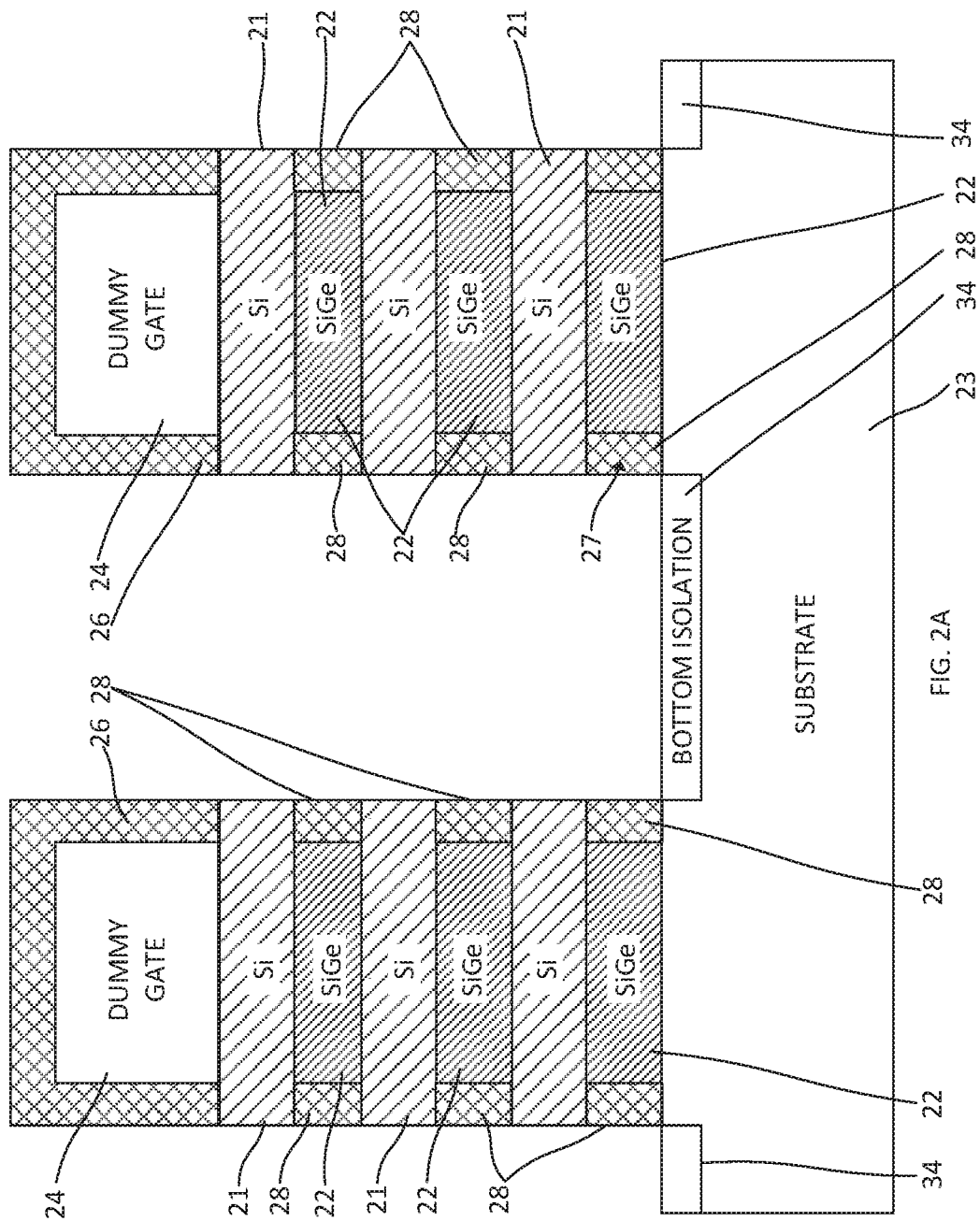
FIG. 2A is a schematic, cross-sectional view showing a structure including stacks of semiconductor nanosheets on a semiconductor substrate.

An exemplary sequence of steps that may be employed during fabrication of a nanosheet transistor including doped extensions is shown in FIGS. 2A-2G. The monolithic structure 40 shown in FIG. 2A is similar to that shown in FIG. 1C and can be obtained in the same manner described above. The same reference numerals are employed to designate the same or substantially similar elements. The structure 40 includes vertical columns 25, each column including a stack of epitaxial semiconductor nanosheet layers including, in alternating sequence, silicon (channel) layers 21 and silicon germanium layers 22. The silicon layers can be essentially undoped, though they may contain some impurities. An amorphous silicon or polycrystalline silicon dummy gate 24 is on each column. Outer spacers 26 encapsulate each dummy gate. Inner spacers 28 adjoining the lateral edges of the silicon germanium layers 22 are located between each opposing pair of silicon layers 21. The spacers 26, 28 may consist essentially of a dielectric material such as silicon nitride or alternatively, for example, silicon oxynitride, SiBCN (silicon borocarbonitride), SiOCN (silicon oxycarbonitride), and/or SiOC (silicon oxycarbide). The structure 40 further includes a bottom electrical isolation layer 34 for electrically isolating the vertical columns 25. An oxide layer or a layer of any other suitable electrically insulating material or other insulating scheme may be employed.

In one or more exemplary embodiments, the epitaxial silicon layers 21 each have a thickness in the range of four to ten nanometers (4-10 nm). The number of silicon (channel) layers in the semiconductor layer stack may vary depending on the desired uses and capabilities of the nanosheet transistor to be fabricated. The silicon layers 21 consist essentially of monocrystalline silicon in some embodiments. The silicon germanium layers 22, which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The silicon germanium layers 22 may have the composition $Si_{1-x}Ge_x$ where x is between 0.2 and 0.8. The silicon and silicon germanium layers can be epitaxially grown in alternating sequence to obtain a vertical stack having the desired number of silicon (channel) layers.

The outer spacers 28 function as a hard mask during formation of the vertical columns 25. A reactive ion etch (RIE) down to the electrical isolation layer 34 may be employed to remove the semiconductor layers 21, 22 outside the outer spacers. The portions of the semiconductor layers 21, 22 beneath the outer spacers and dummy gates remain intact, as illustrated in FIG. 4.

Figure 2B:
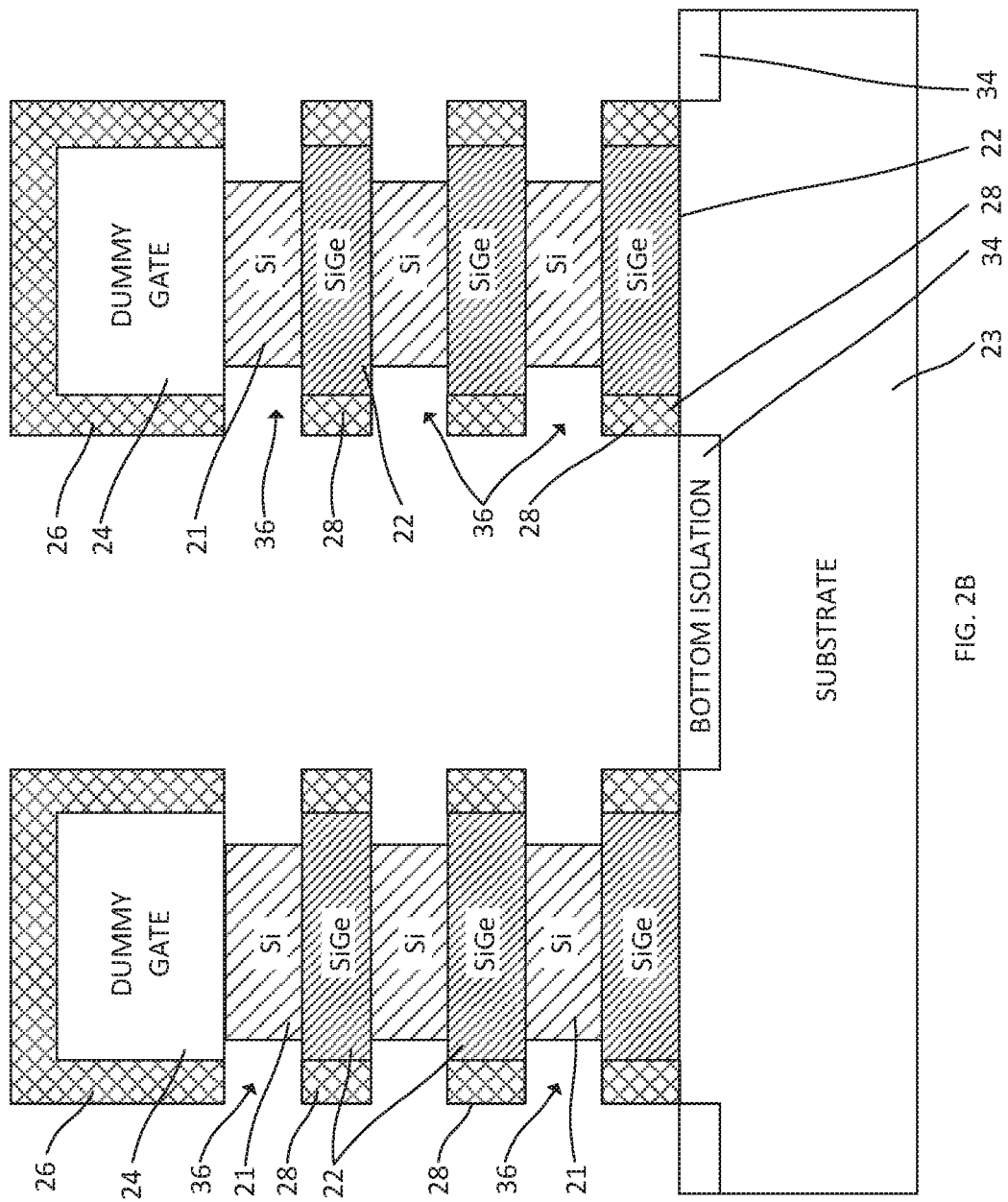
FIG. 2B is a schematic, cross-sectional view shows the structure following recessing of the nanosheet channel layers.

Referring to FIG. 2B, the monolithic structure shown in FIG. 2A can be subjected to a timed anisotropic wet etching process to selectively recess the silicon layers 21. Such a process may employ TMAH (tetramethyl ammonium hydroxide) or ammonia (NH$_4$OH). Lateral recessing of the silicon layers 21 is discontinued once the recesses 36 formed by silicon removal extend through the inner spacers 28 and a sufficient distance within opposing pairs of silicon germanium layers 22. The etch extends the same depth or deeper than the thicknesses of the inner spacer 28, exceeding the thicknesses of the inner spacers end by one to three nanometers (1-3 nm) in one or more embodiments. Some overlapping of the recesses 36 with the silicon germanium layers 22 is preferred, but not too much. The widths of the silicon germanium layers 22 accordingly exceed the widths of the silicon layers following lateral recessing of the silicon layers 21 in one or more embodiments.

Extension regions 38 are epitaxially grown on the exposed lateral surfaces of the silicon nanosheet layers 21 and replace the previously removed channel material within the recesses 36. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Dopants may be incorporated in situ during growth of the extension regions 38 using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial process is selective to dielectric materials such as silicon nitride, so the epitaxial material does not grow on the spacers 26, 28.

In one exemplary embodiment, the source/drain extension regions 38 are boron-doped silicon (Si:B). In a second exemplary embodiment, the source/drain extension regions are phosphorus-doped silicon (Si:P) The dopant selected depends on whether a p-type or an n-type device is to be formed. The doping level of the source/drain extension regions 38 may be between 1e18/cm$^3$ and 5e19/cm$^3$. The doping of the source/drain extension regions can be graded such that the portions of the extension regions adjoining the channels 21 have relatively low doping levels and higher doping levels are formed later during the epitaxial growth thereof. Faceted epitaxial structures are formed that extend into the cavities between adjoining vertical columns 25 of semiconductor nanosheets and possibly merge within the cavities.

Figure 2C:
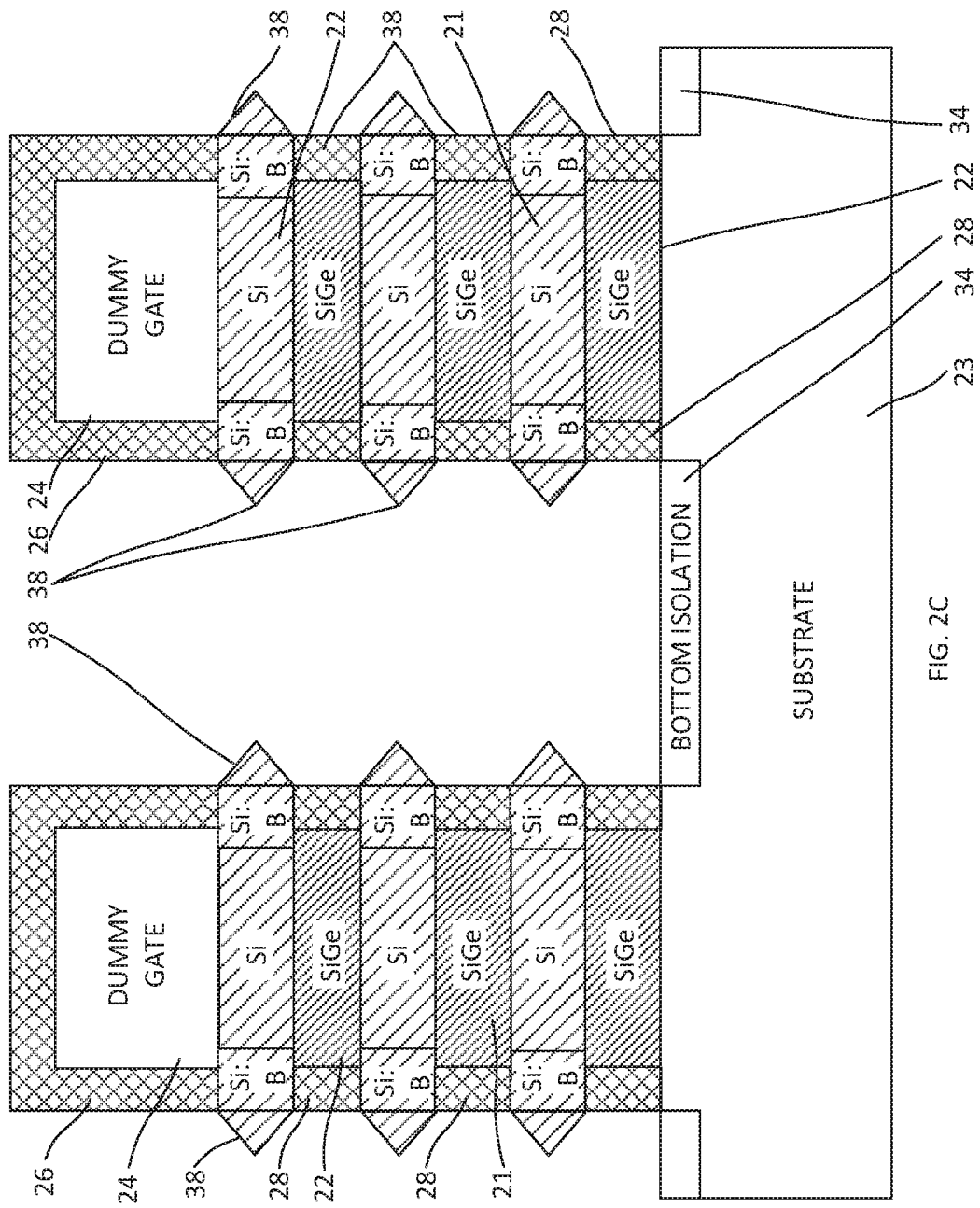
FIG. 2C is a schematic, cross-sectional view thereof following epitaxial growth of extension regions on the nanosheet channel layers.
Figure 2D:
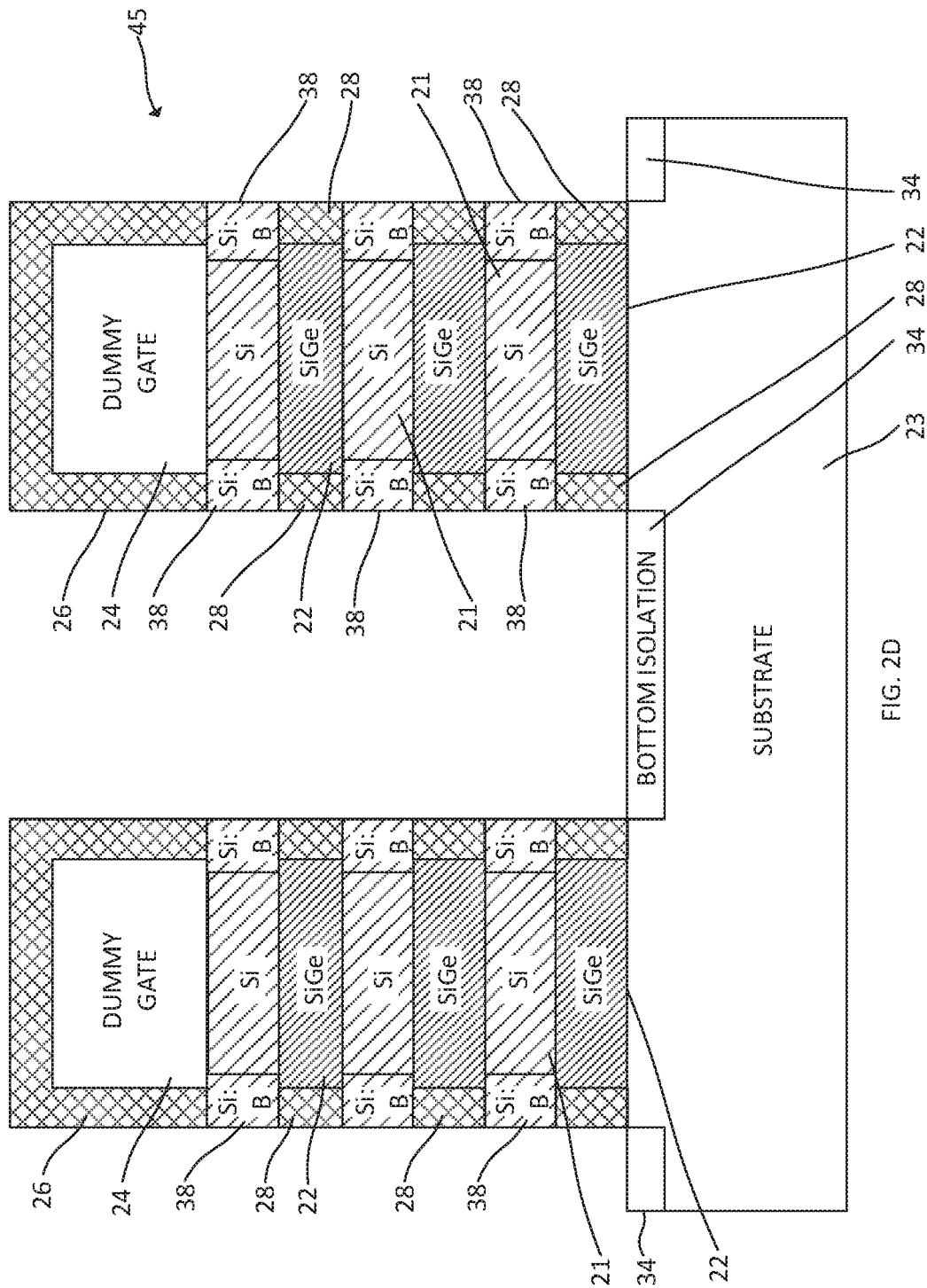
FIG. 2D is a schematic, cross-sectional view thereof following removal of faceted portions of the extension regions.

The portions of the extension regions 38 extending laterally beyond the inner spacers 28 are removed using a reactive ion etch (RIE). A structure 45 as illustrated in FIG. 2D is accordingly obtained. The structure includes doped epitaxial semiconductor extension regions 38 having exposed lateral surfaces and which are vertically aligned with and separated by the dielectric inner spacers 28. The extension regions 38 have greater widths than the inner spacers 28 and accordingly overlap the lateral end portions of the silicon germanium layers 22.

Source/drain regions 29 are epitaxially grown on the exposed surfaces of the extension regions 38. The source/drain regions 29 can be doped in situ. In embodiments including extension regions having p-type conductivity, the dopants may include, for example, a p-type dopant selected from a group of boron (B), gallium (Ga), indium (In), and thallium (Tl) at various concentrations. For example, in a non-limiting example, a dopant concentration range may be low e20/cm$^3$ to mid-e21/cm$^3$, with 4e20/cm$^3$ to 1e21/cm$^3$ preferred. The source/drain regions can include silicon germanium (SiGe) in one or more embodiments. In embodiments wherein pFET devices are formed, the source/drain regions may consist essentially of SiGe:B; for nFET devices, both the source/drain regions and the extension regions may consist essentially of Si:P.

Figure 2E:
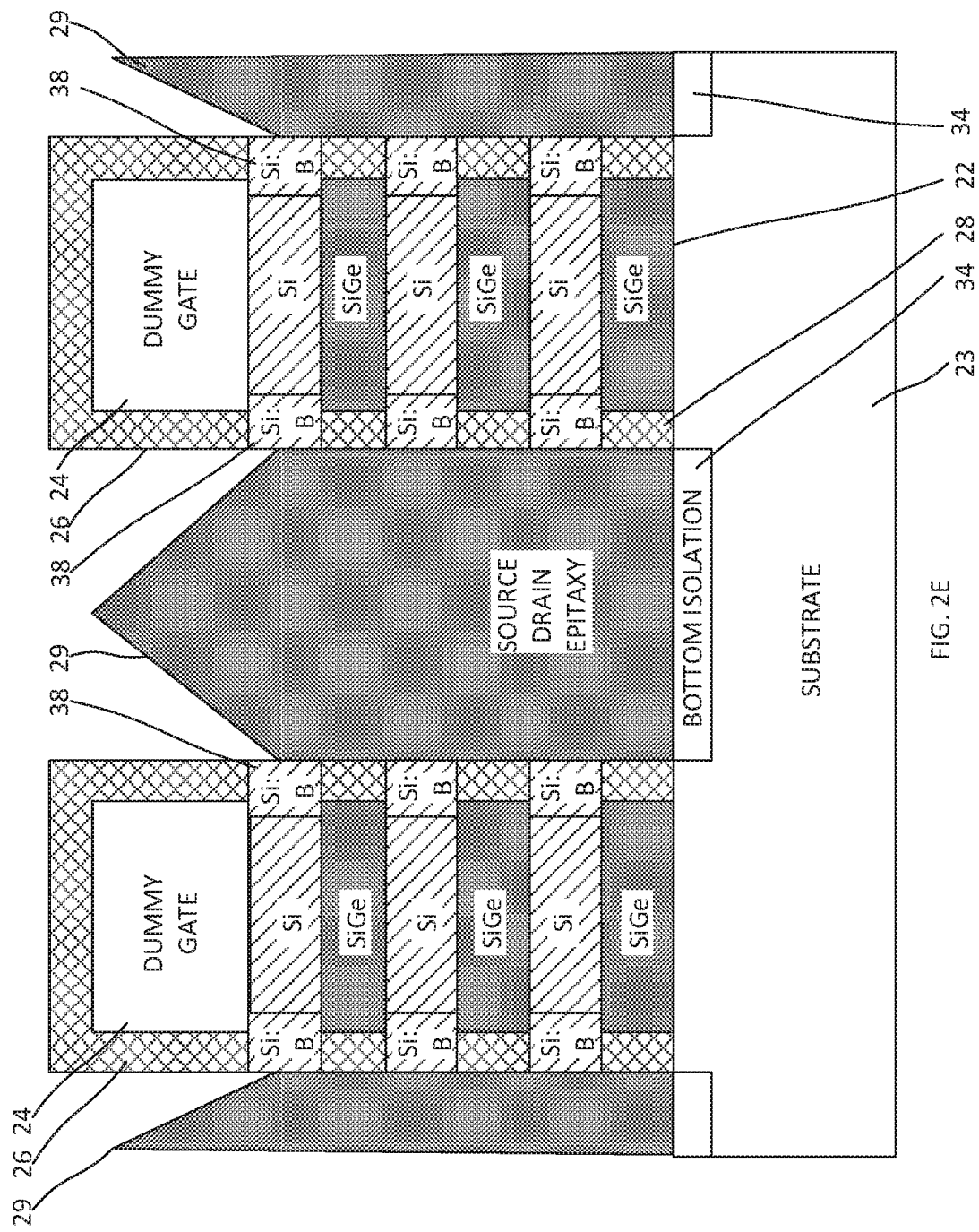
FIG. 2E is a schematic, cross-sectional view thereof following epitaxial growth of source/drain regions on the extension regions.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. A germanium gas source may, for example, be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing source/drain regions 29 described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A structure as shown in FIG. 2E can be obtained.

An interlevel dielectric (ILD) layer 42 is deposited on the structure and planarized. The ILD layer 42 may be formed from any suitable dielectric material, including but not limited to spin-on-glass, a flowable oxide, a high density plasma oxide, borophosphosilicate glass (BPSG), or any combination thereof. The ILD layer is deposited by any suitable deposition process including but not limited to CVD, PVD, plasma-enhanced CVD, atomic layer deposition (ALD), evaporation, chemical solution deposition, or like processes. The ILD layer is planarized using chemical mechanical planarization (CMP) down to the dielectric top spacers 28. It accordingly protects the source/drain regions 29 during subsequent process steps.

Figure 2F:
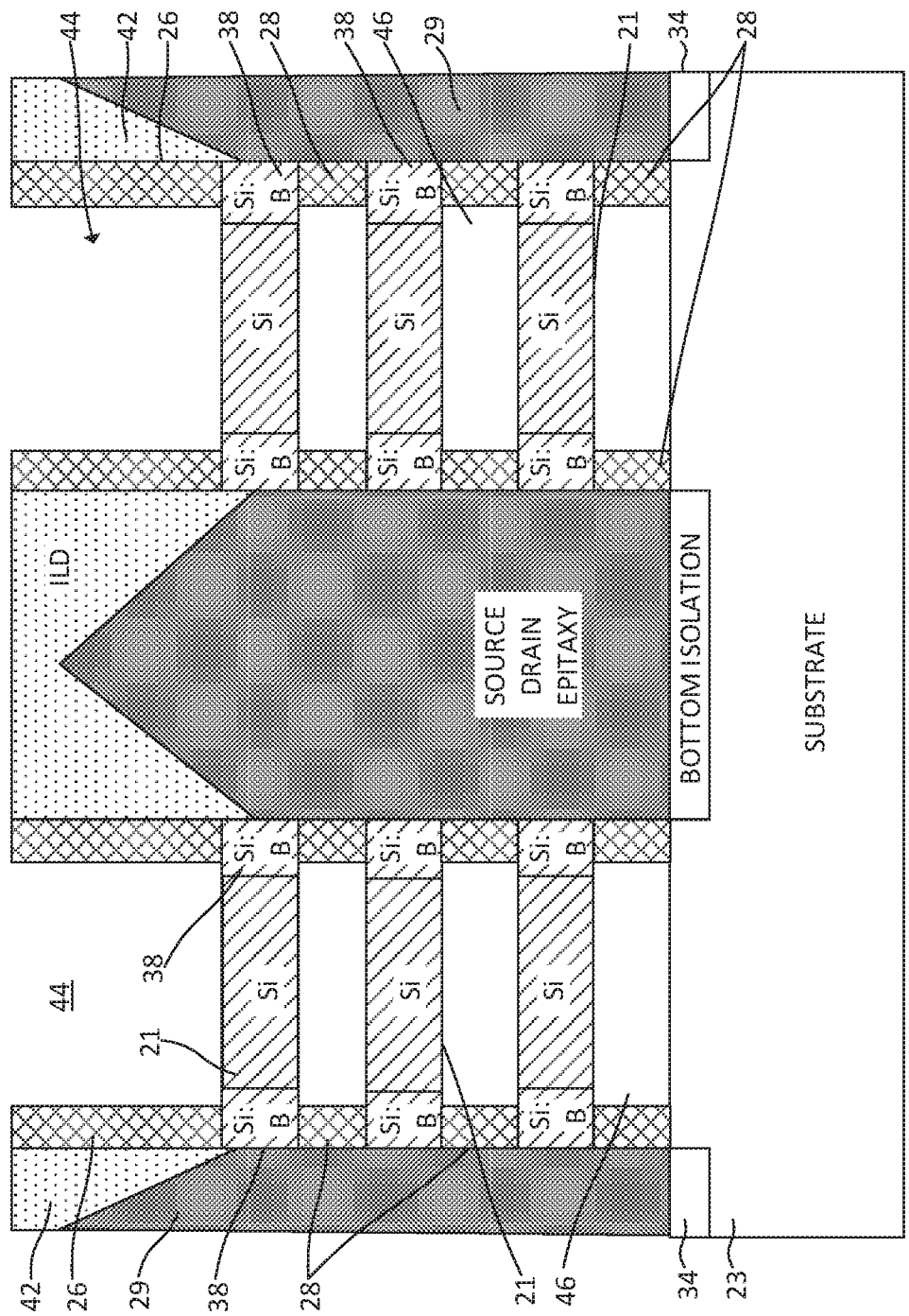
FIG. 2F is a schematic, cross-sectional view thereof following interlevel dielectric deposition, dummy gate removal and removal of sacrificial nanosheets.

A poly open CMP (POC) process is then employed to selectively remove the sacrificial material comprising the dummy gates 24 while leaving the top spacers 28 intact. Trenches 44 bounded by the top spacers 28 are accordingly formed. Once the top (horizontal) portions of the top spacers 28 and the dummy gates 24 are removed, the silicon germanium layers 22 are removed using an etching process that is selective to the silicon nanosheets 21. Hydrogen chloride gas is employed in some embodiments to selectively remove silicon germanium, leaving the silicon nanosheets 21 substantially intact. Alternatively, a wet etch process containing ammonia and hydroperoxide can be used to etch SiGe selective to other materials. As shown in FIG. 2F, horizontal spaces 46 are formed between the silicon (channel) nanosheet layers 21 as well as between the bottom silicon nanosheet layer 21 and the substrate 23. The etch is also selective to the dielectric inner spacers 28 and the doped extensions 38. The inner spacers and extensions effectively isolate the source/drain regions 29 from the etchant. Erosion of the source/drain regions 29 during silicon germanium nanosheet removal is accordingly avoided.

Figure 2G:
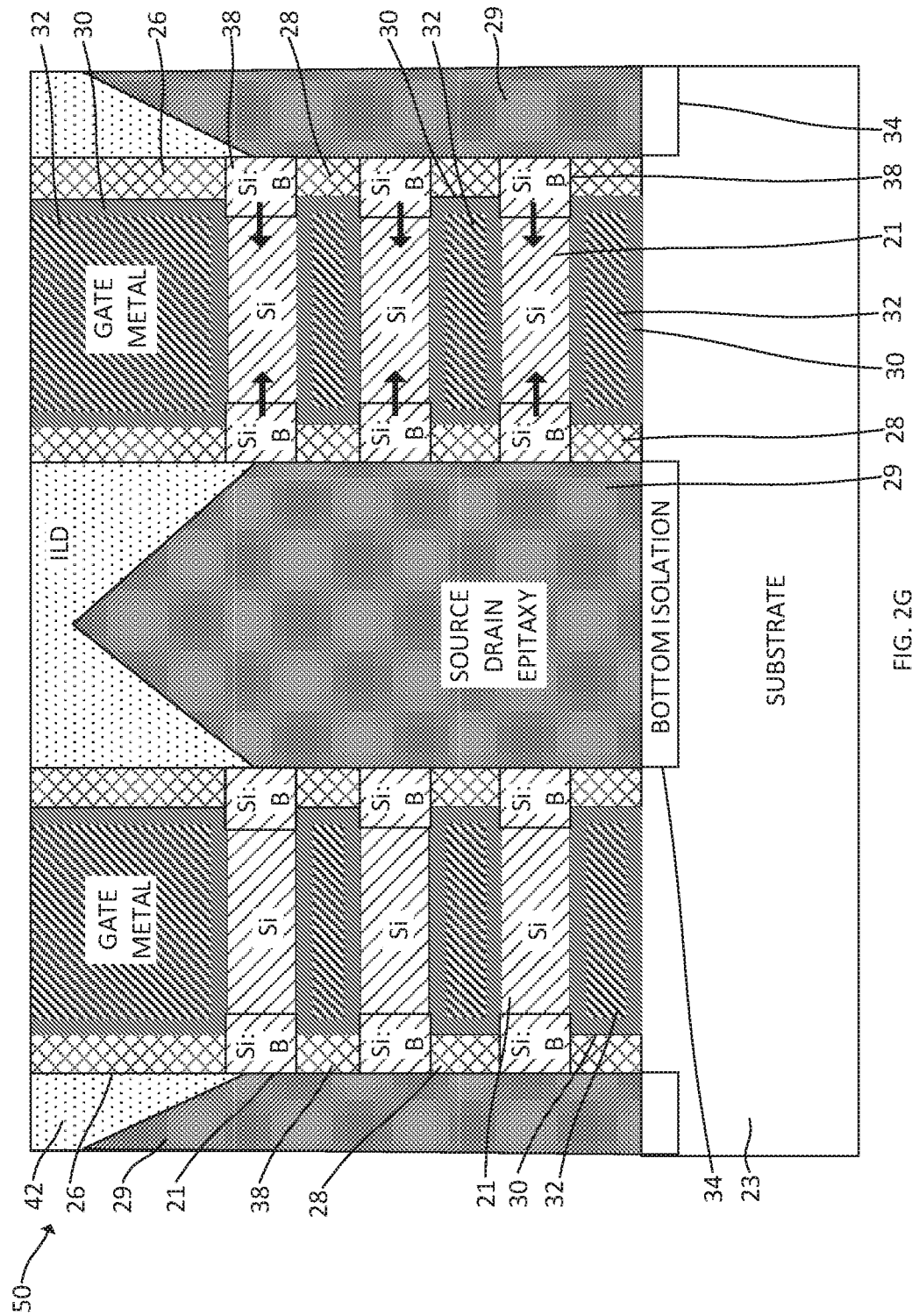
FIG. 2G is a schematic, cross-sectional view thereof following gate formation.

Gate stacks are formed in adjoining relation to the silicon nanosheet (channel) layers 21, thereby obtaining a monolithic structure 50 as schematically illustrated in FIG. 2G. A gate dielectric layer 30 forms portions of the gate stacks that replace the sacrificial silicon germanium layers 22. The gate stacks adjoin the silicon nanosheet channel layers 21, the inner spacers 28 and the outer spacers 26. Non-limiting examples of suitable materials for the gate dielectric layer 30 include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 30 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer 30 includes multiple layers.

Electrically conductive gate material is deposited in the trenches 44 formerly containing the dummy gates 24 and the spaces 46 formerly filled by the silicon germanium layers 22. The deposited metal gate material forms the metal gate 32 of the nanosheet field-effect transistor, as shown in FIG. 2G, including a gate electrode portion within the outer spacers 26 that extends vertically above the stack of nanosheet channel layers. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, or thermal or e-beam evaporation. A planarization process, for example, chemical mechanical planarization (CMP), is performed to polish the top surface of the deposited gate metal material that may form on the structure.

In some embodiments, the electrically conductive gate includes a work function metal (WFM) layer (not shown) disposed between the gate dielectric layer and another electrically conductive metal gate material. The WFM sets the transistor characteristics such as threshold voltage (Vt) to a predetermined value. In some embodiments, the WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process. The nanosheet FET structure at this stage of the exemplary fabrication process includes channel layers 21, operatively associated gate stacks (30, 32), doped epitaxial source/drain regions 29, and doped extension regions between the channel layers and the source/drain regions.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling 1st Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary method of fabricating a nanosheet field-effect transistor includes obtaining a monolithic structure including a vertical stack of nanosheet channel layers 21 and sacrificial silicon germanium layers 22, the nanosheet channel layers and sacrificial silicon germanium layers being arranged in alternating sequence. The nanosheet channel layers of the monolithic structure are greater in width than the sacrificial silicon germanium layers and include lateral edge portions extending laterally beyond the sacrificial silicon germanium layers as shown in FIG. 2A. The monolithic structure further includes a dummy gate 24 and a dielectric outer spacer 26 extending over the dummy gate. Dielectric inner spacers 28 adjoin the ends of the sacrificial silicon germanium layers 22 and are positioned beneath the lateral edge portions of the nanosheet channel layers 21. The nanosheet channel layers of the monolithic structure are recessed in accordance with the method, thereby forming a plurality of divots 36 bounded by the inner spacers 28 and portions of the sacrificial silicon germanium layers 22, as schematically illustrate in FIG. 2B. Doped semiconductor extension regions 38 are epitaxially grown on the nanosheet channel layers 21 and within the plurality of divots 36. As shown in FIG. 2C, the extension regions 38 may further extend beyond the divots 36. Source/drain regions 29 are epitaxially grown on the doped semiconductor extension regions 38. A structure as shown in FIG. 2E may accordingly be obtained. The dummy gate is removed to form a trench 44 bounded by the vertical sidewalls of the dielectric outer spacer 26. The sacrificial silicon germanium layers are then removed selectively with respect to the nanosheet channel layers and the doped semiconductor extension regions to form a plurality of spaces 46 between and in alternating sequence with the nanosheet channel layers, such as shown in FIG. 2F. A gate dielectric layer is deposited within the trench and on the nanosheet channel layers. Gate metal is deposited over the gate dielectric layer. FIG. 2G shows a monolithic structure 50 including a nanosheet field-effect transistor formed in accordance with the exemplary method.

A further method relates to the fabrication of a structure including a plurality of nanosheet field-effect transistors. The method includes obtaining a monolithic structure including a plurality of vertical stacks of monocrystalline silicon nanosheet channel layers 21 and sacrificial silicon germanium layers 22, the nanosheet channel layers and sacrificial silicon germanium layers being arranged in alternating sequence and the sacrificial silicon germanium layers having greater widths than the widths of the nanosheet channel layers. Doped epitaxial extension regions 38 are on the nanosheet channel layers. Dielectric inner spacers 28 adjoin the silicon germanium layers 22 and are vertically aligned with the doped epitaxial extension regions 38. The monolithic structure further includes epitaxial silicon germanium source/drain regions 29 on the doped epitaxial extension regions 38, dielectric dummy gates 24 extending vertically from the top surfaces of the vertical stacks, and dielectric outer spacers 26 including pairs of vertical sidewalls adjoining the dielectric dummy gates. FIG. 2E illustrates an exemplary monolithic structure including such elements. The dielectric dummy gates 24 are removed to form trenches 44 within the vertical sidewalls of the outer dielectric spacers 26. The sacrificial silicon germanium layers 22 are removed selective to the nanosheet channel layers 21 and the doped epitaxial extension regions 38 to form spaces 46 between the nanosheet channel layers without erosion of the source/drain regions 29. FIG. 2F shows an exemplary structure following removal of the silicon germanium layers 22. A gate dielectric layer is deposited within the trenches and on the nanosheet channel layers and gate metal is deposited over the gate dielectric layer. A structure 50 as illustrated in FIG. 2G may be fabricated. The step of obtaining the monolithic structure may include laterally recessing the nanosheet channel layers 21 to form divots 36 between the inner spacers as shown in FIG. 2B prior to epitaxially growing the extension regions 38. The method allows bringing extension dopant closer to the nanosheet field-effect transistor channels without source/drain erosion that could otherwise occur if the silicon germanium source/drain epitaxy was used as extension material. It further facilitates obtaining appropriate doping levels within the extension regions 38.

An exemplary nanosheet field-effect transistor device includes a vertical stack of nanosheet channel layers 21, each nanosheet channel layer consisting essentially of monocrystalline silicon and including a pair of lateral edges. Doped epitaxial extension regions 38 are on the lateral edges of each of the nanosheet channel layers. A plurality of gate stacks (30/32) are arranged in alternating sequence with and operatively associated with the nanosheet channel layers 21. Pair of inner spacers 28 adjoin opposite end portions one of the gate stacks and are vertically aligned with the doped epitaxial extension regions 38. A gate electrode extends vertically from a top surface of the gate stack and within a pair of outer dielectric spacers 26. Epitaxial source/drain regions 29 are operatively associated with the nanosheet channel layers 21 and directly contact the doped epitaxial extension regions 38. The epitaxial source/drain regions 29 and the doped epitaxial extension regions 38 are comprised of different semiconductor materials that can be etched selectively with respect to each other. In some embodiments, the nanosheet channel layers and the epitaxial extension regions 38 consist essentially of the same semiconductor material, the channel layers being essentially undoped and the extension regions being doped.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having nanosheet FET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a nanosheet field-effect transistor, comprising:
   obtaining a monolithic structure including:
      a vertical stack of nanosheet channel layers and sacrificial silicon germanium layers, the nanosheet channel layers including lateral edge portions extending laterally beyond the sacrificial silicon germanium layers;
      a dummy gate on the vertical stack;
      a dielectric outer spacer including vertical sidewalls and extending over the dummy gate; and
      a plurality of dielectric inner spacers, each of the dielectric inner spacers adjoining one of the sacrificial silicon germanium layers and being positioned beneath one of the lateral edge portions of the nanosheet channel layers;
   laterally recessing the nanosheet channel layers, thereby forming a plurality of divots bounded by the inner spacers;
   epitaxially growing doped semiconductor extension regions on the nanosheet channel layers and within the plurality of divots;
   subsequent to laterally recessing the nanosheet channel layers, epitaxially growing source/drain regions on the doped semiconductor extension regions;
   removing the dummy gate to form a trench bounded by the vertical sidewalls of the dielectric outer spacer;
   removing the sacrificial silicon germanium layers selectively with respect to the nanosheet channel layers and the doped semiconductor extension regions to form a plurality of spaces between and in alternating sequence with the nanosheet channel layers;
   forming a gate dielectric layer within the trench and on the nanosheet channel layers; and
   depositing gate metal over the gate dielectric layer.

2. The method of claim 1, wherein the nanosheet channel layers consist essentially of monocrystalline silicon, the source/drain regions consist essentially of doped silicon or doped silicon germanium, and the doped semiconductor extension regions consist essentially of doped silicon.

3. The method of claim 2, wherein epitaxially growing the doped semiconductor extension regions further includes:
   causing the doped semiconductor extension regions to extend outside the divots, and
   removing portions of the doped semiconductor extension regions extending outside the divots.

4. The method of claim 3, further including depositing an interlevel dielectric layer over the source/drain regions.

5. The method of claim 3, wherein the doped semiconductor extension regions consist essentially of boron doped silicon or phosphorus doped silicon.

6. The method of claim 3, wherein the source/drain regions consist essentially of boron doped silicon germanium.

7. The method of claim 3, wherein the outer spacer comprises silicon nitride.

8. The method of claim 3, wherein removing the sacrificial silicon germanium layers includes introducing an etchant for selectively etching silicon germanium over silicon.

9. The method of claim 1, wherein epitaxially growing the doped semiconductor extension regions further includes increasing doping levels of the doped semiconductor extension regions during epitaxial growth thereof.

10. The method of claim 1, wherein laterally recessing the nanosheet channel layers further includes causing the divots to further bound portions of the sacrificial silicon germanium layers.

11. A method of fabricating a structure including nanosheet field-effect transistors, comprising:
   obtaining a monolithic structure including:
   a plurality of vertical stacks of monocrystalline silicon nanosheet channel layers and sacrificial silicon germanium layers;
   a plurality of doped epitaxial extension regions on the nanosheet channel layers, doped epitaxial extension regions disposed on opposing lateral edges of each of the nanosheet channel layers in each of at least a subset of the vertical stacks being of a same conductivity type;
   a plurality of dielectric inner spacers adjoining the silicon germanium layers and vertically aligned with the doped epitaxial extension regions;
   epitaxial silicon germanium source/drain regions on the doped epitaxial extension regions,
   a plurality of dielectric dummy gates, each dielectric dummy gate extending vertically from a top surface of one of the vertical stacks, and
   a plurality of dielectric outer spacers, each of the outer spacers including a pair of vertical sidewalls adjoining one of the dielectric dummy gates;
   removing the dielectric dummy gates to form trenches within the vertical sidewalls of the dielectric outer spacers;
   removing the sacrificial silicon germanium layers selective to the nanosheet channel layers and the doped epitaxial extension regions to form spaces between the nanosheet channel layers;
   forming a gate dielectric layer within the trenches and on the nanosheet channel layers; and
   depositing gate metal over the gate dielectric layer.

12. The method of claim 11, wherein the inner spacers and the doped epitaxial extension regions include outer surfaces and each of the vertical stacks includes a pair of substantially planar exterior surfaces comprising the outer surfaces of the doped epitaxial extension regions and the inner spacers.

13. The method of claim 12, wherein obtaining the monolithic structure includes laterally recessing the nanosheet channel layers to form divots between the inner spacers.

14. The method of claim 11, wherein the nanosheet channel layers and sacrificial silicon germanium layers in each of at least a subset of the vertical stacks are arranged in an alternating sequence.

15. The method of claim 11, wherein removing the sacrificial silicon germanium layers is performed without erosion of the source/drain regions.

* * * * *